United States Patent
Kim et al.

(10) Patent No.: US 11,300,450 B2
(45) Date of Patent: Apr. 12, 2022

(54) HYPERSPECTRAL IMAGING SPECTROSCOPY METHOD USING KALEIDOSCOPE AND SYSTEM THEREFOR

(71) Applicant: Korea Advanced Institute of Science and Technology, Daejeon (KR)

(72) Inventors: Min Hyuk Kim, Daejeon (KR); Daniel Jeon, Daejeon (KR)

(73) Assignee: KOREA ADVANCED INSTITUTE OF SCIENCE AND TECHNOLOGY, Daejeon (KR)

(*) Notice: Subject to any disclaimer, the term of this patent is extended or adjusted under 35 U.S.C. 154(b) by 423 days.

(21) Appl. No.: 15/637,884

(22) Filed: Jun. 29, 2017

(65) Prior Publication Data

US 2018/0045568 A1    Feb. 15, 2018

(30) Foreign Application Priority Data

Aug. 10, 2016    (KR) .................. 10-2016-0101653
Apr. 11, 2017    (KR) .................. 10-2017-0046460

(51) Int. Cl.
*G01J 3/28*      (2006.01)
*G01J 3/02*      (2006.01)
(Continued)

(52) U.S. Cl.
CPC ........... *G01J 3/2823* (2013.01); *G01J 1/0411* (2013.01); *G01J 1/0474* (2013.01); *G01J 3/021* (2013.01);
(Continued)

(58) Field of Classification Search
CPC ...... G01J 3/2823; G01J 1/0474; G01J 3/0291; G01J 3/18; G01J 3/0208; G01J 1/0411; G01J 2003/2826; H01L 27/14625
See application file for complete search history.

(56) References Cited

U.S. PATENT DOCUMENTS 3,661,439 A * 5/1972 Burnside, III ......... G02B 27/08
                                                   353/1
5,487,172 A * 1/1996 Hyatt .................. B60R 16/0373
                                                   700/8
(Continued)

FOREIGN PATENT DOCUMENTS

JP    2014137815 A    7/2014
KR    20090070258 A    7/2009
KR    20130076978 A    7/2013

OTHER PUBLICATIONS

Manakov et al., "A Reconfigurable Camera Add-On for High Dynamic Range, Multispectral, Polarization, and Light-Field Imaging", ACM Transactions on Graphics, Association for Computing Machinery, 2013, Proceeding of SIGGRAPH, 32 (4) pp. 47:1-47:14.
(Continued)

*Primary Examiner* — Mohamed K Amara
(74) *Attorney, Agent, or Firm* — Blank Rome LLP (57) ABSTRACT

A method and a system for acquiring a hyperspectral image by using a kaleidoscope are provided. The method includes copying an input image to generate a specific number of images, generating coded-aperture passed images corresponding to the images by using at least one coded aperture, and acquiring a hyperspectral image for the input image based on the coded-aperture passed images.

17 Claims, 6 Drawing Sheets

(51) Int. Cl.
*G01J 3/18* (2006.01)
*G01J 1/04* (2006.01)
*H01L 27/146* (2006.01)
*G01J 3/14* (2006.01)

(52) U.S. Cl.
CPC ........... *G01J 3/0205* (2013.01); *G01J 3/0208* (2013.01); *G01J 3/0229* (2013.01); *G01J 3/0291* (2013.01); *G01J 3/14* (2013.01); *G01J 3/18* (2013.01); *G01J 3/2846* (2013.01); *H01L 27/14625* (2013.01); *G01J 2003/2826* (2013.01)

(56) References Cited

U.S. PATENT DOCUMENTS

| | | | | |
|---|---|---|---|---|
| 5,627,639 | A * | 5/1997 | Mende | G01J 3/2823 356/310 |
| 5,737,075 | A * | 4/1998 | Koch | G01S 7/4816 342/179 |
| 5,900,942 | A * | 5/1999 | Spiering | G01J 3/2823 348/188 |
| 7,336,353 | B2 * | 2/2008 | Brady | G01J 3/02 356/310 |
| 9,014,999 | B2 * | 4/2015 | Turbell | G01B 11/2504 702/104 |
| 9,297,999 | B2 * | 3/2016 | George | G02B 26/023 |
| 9,635,274 | B2 * | 4/2017 | Lin | H04N 5/2258 |
| 9,936,188 | B2 * | 4/2018 | Klehm | H04N 5/2254 |
| 10,012,537 | B2 * | 7/2018 | Garsha | G01J 3/28 |
| 10,176,562 | B2 * | 1/2019 | Gill | G02B 5/18 |
| 10,228,283 | B2 * | 3/2019 | Nath | G01J 3/36 |
| 2007/0097363 | A1 * | 5/2007 | Brady | G01J 3/02 356/310 |
| 2008/0253656 | A1 * | 10/2008 | Schwartzberg | G06K 9/3258 382/181 |
| 2009/0086081 | A1 * | 4/2009 | Tan | G01B 11/25 348/333.1 |
| 2011/0002505 | A1 * | 1/2011 | Barrow | G02B 27/1013 382/103 |
| 2012/0154595 | A1 * | 6/2012 | Sassi | G06F 3/017 348/164 |
| 2014/0252200 | A1 * | 9/2014 | Garsha | G02B 21/367 250/201.3 |
| 2016/0057407 | A1 * | 2/2016 | Klehm | H04N 5/2254 348/343 |
| 2017/0277966 | A1 * | 9/2017 | Abousleman | G06K 9/3233 |
| 2017/0287124 | A1 * | 10/2017 | Lim | G06T 7/001 |
| 2021/0389240 | A1 * | 12/2021 | Labayrade | G01J 3/0291 |

OTHER PUBLICATIONS

Arguello et al., "Higher-Order Computational Model for Coded Aperture Spectral Imaging", Applied Optics, vol. 52, No. 10, Apr. 2013, pp. D12-D21.

* cited by examiner

HYPERSPECTRAL IMAGING SPECTROSCOPY METHOD USING KALEIDOSCOPE AND SYSTEM THEREFOR

CROSS-REFERENCE TO RELATED APPLICATIONS

A claim for priority under 35 U.S.C. § 119 is made to Korean Patent Application No. 10-2016-0101653 filed Aug. 10, 2016, and Korean Patent Application No. 10-2017-0046460 filed Apr. 11, 2017, in the Korean Intellectual Property Office, the entire contents of which are hereby incorporated by reference.

BACKGROUND

Embodiments of the inventive concept described herein relate to technologies of acquiring hyperspectral images using kaleidoscope, and more particularly, relate to methods and systems for acquiring a hyperspectral image having high resolving power (high resolution) by acquiring multiple samples in a single shot.

To observe the whole spectral information of light, each spectral region needs to be separately captured. Although many times of capturing ensure high spectral resolution and high spatial resolution, if a subject to be captured or a camera moves, the position of the subject may vary at each time of capturing, and thus an appropriate hyperspectral image may not be observed. In addition, since it takes long time to observe a hyperspectral image, there is a difficulty in acquiring a moving picture.

To solve the above problems, a technology of acquiring a hyperspectral image in a single shot by using a coded aperture has been suggested. The method of using the coded aperture has been first introduced by Wagadarikar, and is called a coded aperture snapshot spectral imaging (CASSI). According to CASSI, a moving subject may be observed, but lower resolving power is exhibited. To increase the resolution in CASSI, technologies of increasing the number of samples have been suggested.

Among the conventional technologies of increasing the number of samples, Kittle captures coded images multiple times while changing the position of a coded aperture by using a position changing system, and Wang captures coded images multiple times while changing a pattern of the coded aperture by using a digital micro-mirror device (DMD).

According to the schemes, since the number of samples is increased, a more accurate image is observed. However, there may be a difficulty in acquiring a hyperspectral image in a single shot.

Accordingly, a system or a method capable of acquiring a hyperspectral image having high resolving power in a single shot is required.

SUMMARY

Embodiments of the inventive concept provide methods and systems for acquiring a hyperspectral image having high resolving power by acquiring multiple samples in a single shot to increase the number of samples.

In detail, embodiments of the inventive concept provide methods and systems for acquiring a single-shot high resolution hyperspectral image by copying an input image to generate multiple images using a kaleidoscope and by allowing the multiple images to pass through mutually different coded apertures to acquire multiple samples.

According to an aspect of an embodiment of the inventive concept, a camera device includes mirrors generating a specific number of images corresponding to an input image, at least one coded aperture generating coded-aperture passed images corresponding to the images, respectively, and a controller acquiring a hyperspectral image for the input image based on the coded-aperture passed images.

Further, according to an embodiment of the inventive concept, the camera device may further include a dispersive medium providing dispersive image information for each of the coded-aperture passed images. The controller may observe the hyperspectral image for the input image based on the dispersive image information.

The dispersive medium may include at least one of a prism, a diffraction grating, and a bandpass filter.

The mirrors may include a kaleidoscope generating the specific number of images.

The controller may perform geometric calibration with respect to the observed hyperspectral image.

The controller may perform the geometric calibration with respect to the observed hyperspectral image by calculating a homography matrix based on a photographed checkerboard as a checkerboard is photographed and by applying the calculated homography matrix to the observed hyperspectral image.

The controller may perform the geometric calibration with respect to the observed hyperspectral image by performing primary geometric calibration using the homographic matrix and by performing secondary geometric calibration using an optical flow algorithm.

The controller may calculate radiance of the observed hyperspectral image and may perform color calibration with respect to the observed hyperspectral image based on the calculated radiance.

According to another aspect of an embodiment of the inventive concept, a method of acquiring a hyperspectral image includes copying an input image to generate a specific number of images, generating coded-aperture passed images corresponding to the images, respectively, by using at least one coded aperture, and acquiring a hyperspectral image for the input image based on the coded-aperture passed images.

Further, according to an embodiment of the inventive concept, the method may further include acquiring dispersive image information for each of the coded-aperture passed images as each of the coded-aperture passed image is dispersed by a dispersive medium. The acquiring of the hyperspectral image for the input image may include acquiring the hyperspectral image for the input image based on the dispersive image information.

The dispersive medium may include at least one of a prism, a diffraction grating, and a bandpass filter.

The copying of the input image to generate the specific number of images may include copying the input image to generate the specific number of images by using a kaleidoscope.

Further, according to an embodiment of the inventive concept, the method may further include performing geometric calibration with respect to the observed hyperspectral image.

The performing of the geometric calibration with respect to the observed hyperspectral image may include performing the geometric calibration with respect to the observed hyperspectral image by calculating a homography matrix based on a photographed checkerboard as a checkerboard is photographed and by applying the calculated homography matrix to the observed hyperspectral image.

The performing of the geometric calibration with respect to the observed hyperspectral image may include performing the geometric calibration with respect to the observed hyperspectral image by performing primary geometric calibration using the homographic matrix and by performing secondary geometric calibration using an optical flow algorithm.

Further, according to an embodiment of the inventive concept, the method may further include calculating radiance of the observed hyperspectral image, and performing color calibration with respect to the observed hyperspectral image based on the calculated radiance.

According to another aspect of an embodiment of the inventive concept, a method of acquiring a hyperspectral image includes generating a specific number of images with respect to an input image, generating coded-aperture passed images corresponding to the generated images, respectively, by applying different coded-apertures to the generated image, and acquiring a hyperspectral image for the input image in a single shot, based on the generated coded-aperture passed images.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in detail with reference to the accompanying drawings. However, the embodiments are not intended to limit the technical spirit of the inventive concept, and the scope of the inventive concept is not limited by the embodiments. In addition, the same reference numerals of accompanying drawings will be assigned to the same or like members.

According to embodiments of the inventive concept, a subject matter is to provide a system and a method of acquiring a single-shot high resolution hyperspectral image, capable of acquiring high resolving power (high resolution) in a single shot by using a coded aperture snapshot spectral imaging (CASSI) system and a kaleidoscope.

According to the inventive concept, multiple samples may be acquired in a single shot by generating copies of an input image using a kaleidoscope and by allowing the copies of the input image to pass through mutually different coded apertures.

According to the inventive concept, the CASSI refers to a scheme or system capable of extracting spatial information and spectral information from an overlap image through a compressive sensing scheme. Since CASSI is well known to those skilled in the art, the details thereof will be omitted.

According to the inventive concept, a hyperspectral image may be reconstructed based on an algorithm of Kittle of reconstructing a hyperspectral image with respect to multiple samples by expanding the CASSI.

Figure 1:
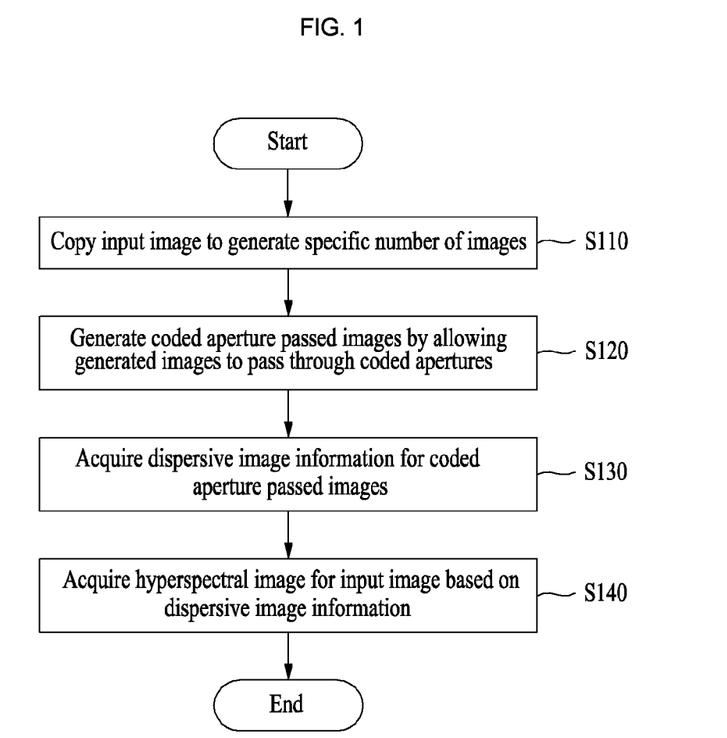
FIG. 1 is a flowchart illustrating a method of acquiring a hyperspectral image, according to an embodiment of the inventive concept.

FIG. 1 is a flowchart illustrating a method of acquiring a hyperspectral image, according to an embodiment of the inventive concept.

As illustrated in FIG. 1, according to an embodiment of the inventive concept, a method of acquiring a hyperspectral image includes copying an input image to generate a specific number of images (S110), generating coded-aperture passed images by allowing the images to pass through coded apertures, (S120), acquiring dispersive image information for each coded-aperture passed image (S130), and acquiring a hyperspectral image with respect to the input image based on the dispersive image information (S140).

In operation S110, an input image may be copied to generate a plurality of images by using a kaleidoscope. In operation S120, coded-aperture passed images may be generated by allowing the images to pass through relevant coded apertures different from each other. In operation S130, dispersive image information may be acquired with respect to each coded-aperture passed image through a dispersive medium including at least one of a prim, a diffraction grating, and a bandpass filter.

For example, in operation S130, the dispersive image information may be acquired by using a prism, a diffraction grating, or a bandpass filter. Further, in operation 130, the dispersive image information may be acquired by using a prism and a bandpass filter or by using a diffraction grating and a bandpass filter. Hereinafter, the inventive concept will be described while focusing on the prism serving as the dispersive medium for the convenience of explanation. Even if the following description is made in terms of the prims serving as the dispersive medium, the dispersive medium may include at least one of the prism, the diffraction grating, and the bandpass filter described above.

Hereinafter, the method will be described in detail with reference to FIG. 2, according to the inventive concept.

Figure 2:
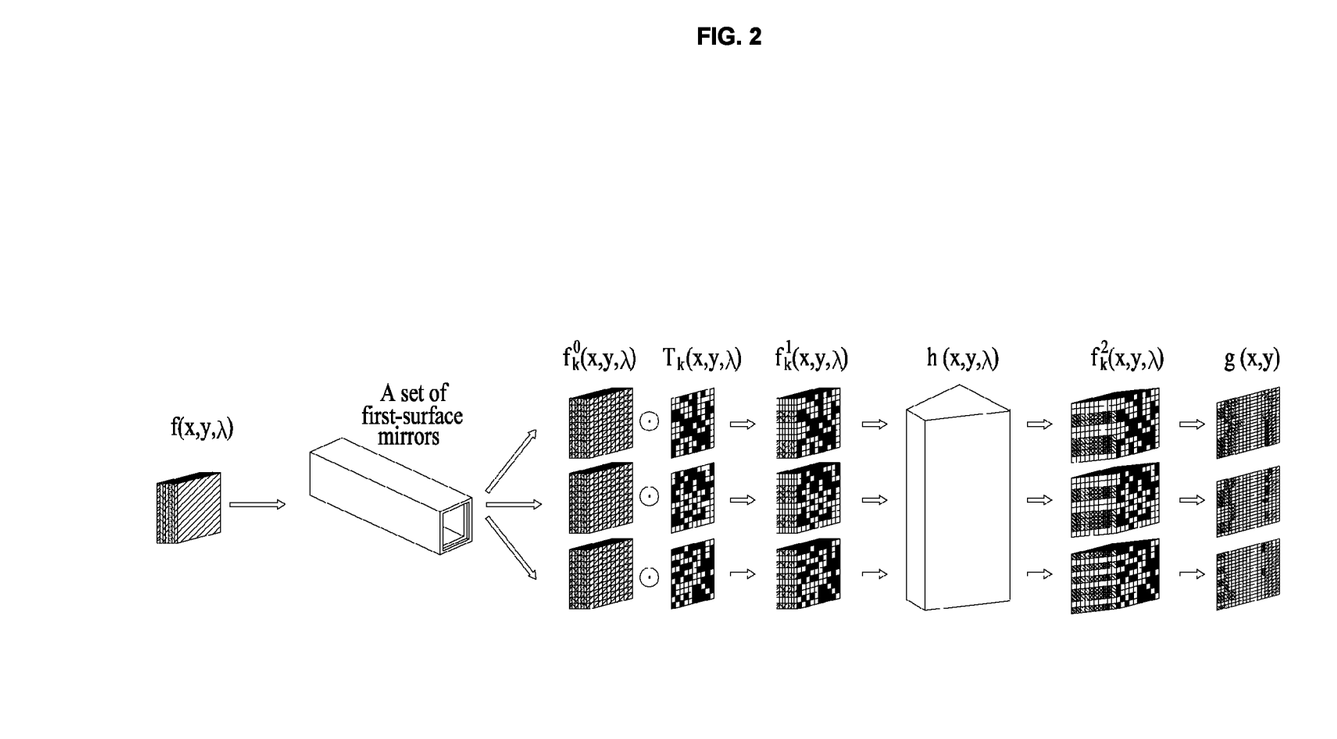
FIG. 2 is a view illustrating the concept of a process of acquiring a hyperspectral image, according to an embodiment of the inventive concept.

FIG. 2 is a view illustrating the concept of a process of acquiring an hyperspectral image, according to an embodiment of the inventive concept;

As illustrated in FIG. 2, according to embodiments of the inventive concept, image information on a scene which is input into a camera may be considered to be three-dimensional cubic information, f(x, y, λ), including a horizontal axis, a vertical axis, and a spectral axis. In this case, λ may refer to a wavelength of light, and (x, y) may refer to spatial position information.

In this case, when it is assumed that the cubic information is copied while passing through a kaleidoscope to generate several pieces of identical cubic information, and k images are generated through the kaleidoscope, each of the k images may be represented in the form of $f_k^0$, and the k images may be expressed in following Equation 1.

$$f = [f_1^0, f_2^0, \ldots, f_k^0] \qquad \text{[Equation 1]}$$

The copied images pass through relevant coded apertures and thus are transformed to mutually different cubes.

In this case, functions of the coded apertures may be represented in the form of $T = [T_1, T_2, \ldots, T_k]$, and images, $f_k^1(x,y,\lambda)$, acquired through the relevant coded apertures are expressed in following Equation 2.

$$f_k^1(x,y,\lambda) = f_k^0(x,y,\lambda) T_k(x,y) \quad \text{[Equation 2]}$$

Then, each piece of cubic information is dispersed by the prim and is shifted in a horizontal axis by a different size in each spectral region, thereby forming a cubic shape having one side slanted.

Since the dispersion only depends on a wavelength regardless of a position, the dispersion may be expressed in a function $\phi(\lambda)$ having a wavelength $\lambda$ as a parameter, and the dispersed image information $f_k^2(x,y,\lambda)$ may be expressed in following Equation 3.

$$f_k^2(x, y, \lambda) = \int\int \delta(x' - [x + \phi(\lambda)])\delta(y' - y) f_k^1(x', y', \lambda) dx' dy'$$

$$= \int\int h(x' + \phi(\lambda), x, y', y, \lambda) f_k^1(x', y', \lambda) dx' dy' \quad \text{[Equation 3]}$$

In Equation 3, $\delta$ may denote a Dirac delta function.

The Dirac delta function is a function that has values of zeroes at remaining points except for a point of an input of zero. Since dispersed light propagates from one point to another point, the light may be represented by an integration of two dimensional (2D) Dirac delta functions. The 2D Dirac delta functions may be represented with a common factor h.

Information $g_k(x, y)$ observed by a camera is not 3D information including a horizontal axis, a vertical axis, and a spectral axis, but 2D image information integrated along a spectral axis. Accordingly, the information $g_k(x, y)$ may represented by an integration with respect to wavelength $\lambda$ as expressed in following Equation 4.

$$g_k(x, y) = \int_\lambda \int\int h(x' + \phi(\lambda), x, y', y, \lambda) f_k^1(x', y', \lambda) dx' dy' d\lambda$$

$$= \int_\lambda \int\int h(x' + \phi(\lambda), x, y', y, \lambda) T_k(x, y) f_k^0(x', y', \lambda) dx' dy' d\lambda \quad \text{[Equation 4]}$$

Actually, the camera performs observation in a sensor pixel unit, and the intensity of light observed at each pixel is considered to be the total summation of quantities of incident light corresponding to a pixel size. Accordingly, the intensity of light may be expressed in following Equation 5.

$$g_{ijk} = \int\int g_k(x, y) rect\left(\frac{x}{\Delta} - i, \frac{y}{\Delta} - j\right) dx dy,$$

$$= \int\int\int_\Lambda \int\int h(x' + \phi(\lambda), x, y', y, \lambda) T_k(x, y) \times f_k^0(x', y', \lambda) rect\left(\frac{x}{\Delta} - i, \frac{y}{\Delta} - j\right) dx' dy' d\lambda dx dy. \quad \text{[Equation 5]}$$

In Equation 5, 'i' and 'j' may denote horizontal and vertical positions of the pixel.

Similarly, a function of the coded aperture may be represented in a pixel unit, and thus the function of the coded aperture may be expressed in following Equation 6.

$$T_k(x, y) \sum_{i',j'} T_{i'j'k} \, rect\left(\frac{x}{\Delta'} - i', \frac{y}{\Delta'} - j'\right) \quad \text{[Equation 6]}$$

By using Equation 6 described above, Equation 5 may be expressed in following Equation 7.

$$g_{ijk} = \sum_{i',j'} T_{i'j'k} \int\int\int_\Lambda \int\int h(x' + \phi(\lambda), x, y', y, \lambda) \times rect\left(\frac{x}{\Delta'} - i', \frac{y}{\Delta'} - j'\right) \times f_k^0(x', y', \lambda) rect\left(\frac{x}{\Delta} - i, \frac{y}{\Delta} - j\right) dx' dy' d\lambda dx dy. \quad \text{[Equation 7]}$$

The above equation may be represented in the form of a matrix vector. Hyperspectral image information is 3D information $f \in \mathbb{R}^{ijl}$ having l wavelengths, and may be represented in the form of a vector. A function of projecting the hyperspectral information to a sensor may be represented in the form of a binary matrix $H \in \mathbb{R}^{ijkl \times ijl}$. IN addition, $g \in \mathbb{R}^{ijk}$, which is an image vector observed by the camera, may be represented by a product of a matrix H and a vector f as expressed in following Equation 8.

$$g = Hf \quad \text{[Equation 8]}$$

Since the g, which is information observed by the camera, and the H, which is a transformation function, are known in Equation 8, f may be obtained from Equation 8. To obtain f, a linear inversion problem needs to be solved, and to this end, a total variation may be set to a normalization item and a two-step iterative shrinkage/Thresholding (TwIST) algorithm may be used.

In this case, f may be obtained by minimizing $\|g - Hf\|_2^2$, and an optimization may be represented by Lagrangian relaxation as expressed in following Equation 9.

$$\min_f \frac{1}{2}\|g - Hf\|_2^2 + \tau \Gamma(f) \quad \text{[Equation 9]}$$

In Equation 9, $\Gamma$ may denote a function of obtaining the total variation, and $\tau$ may denote a weight of the total variation, for example, 0.1.

The total variation may be represented as a summation of a traverse variation and a longitudinal variation of an image and may be expressed in following Equation 10.

$$\Gamma(f) = \Sigma_l \Sigma_{i,j} \{|f(i+1,j,l) - f(i,j,l)| + |f(i,j+1,l) - f(i,j,l)|\} \quad \text{[Equation 10]}$$

Since Equation 10 represents a total variation based on the isotropic L1 norm and the L1 norm is known as being robust, gradient sparsity of 'f' may be applied. According to the inventive concept, spatial variations in the horizontal axis and the vertical axis in the spectral data cube may be summed. In this case, during the calculation of the total variation, spatial smoothness may be explicitly considered without spectral smoothness, and a steep gradient variation may be illustrated along the spectral axis.

Figure 3:
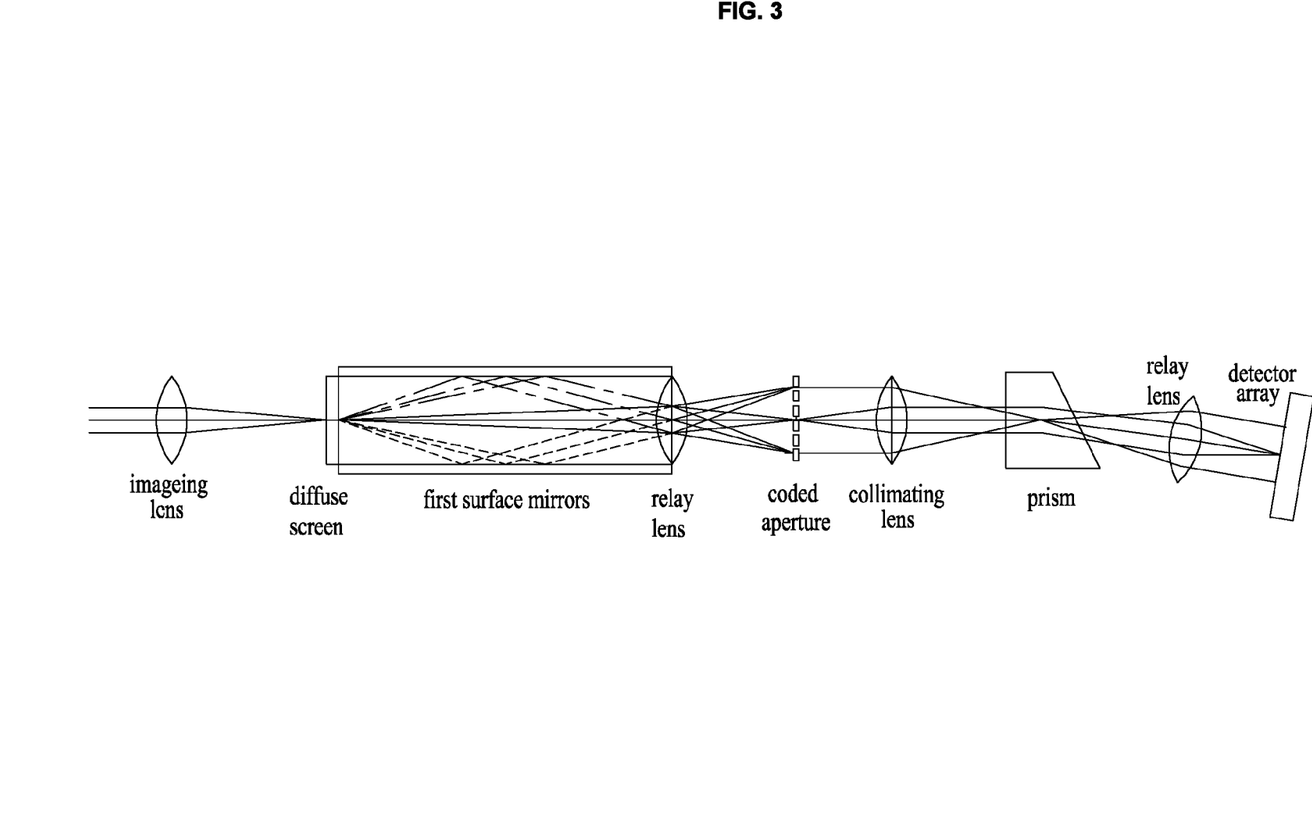
FIG. 3 is a schematic view illustrating a system for acquiring a hyperspectral image, according to an embodiment of the inventive concept.

FIG. 3 is a schematic view illustrating a system for acquiring a hyperspectral image, according to an embodiment of the inventive concept;

Referring to FIG. 3, according to an embodiment of the inventive concept, in the system for acquiring the hyperspectral image, an object lens receives light such that an image is focused on a diffuser. The image focused on the diffuser is reflected from first-surface mirrors, for example, mirrors of a kaleidoscope while the image is copied to generate multiple images.

After the images pass through a relay lens, the images are focused on mutually different coded apertures.

In this case, the size of the image copy may be determined depending on a focal length of the relay lens and a length of the kaleidoscope, and an image magnification ratio m may be expressed in following Equation 11.

$$m = \frac{b}{a} = \frac{1}{a/f - 1} \text{ s.t. } \frac{1}{a} + \frac{1}{b} = \frac{1}{f} \qquad \text{[Equation 11]}$$

Figure 4:
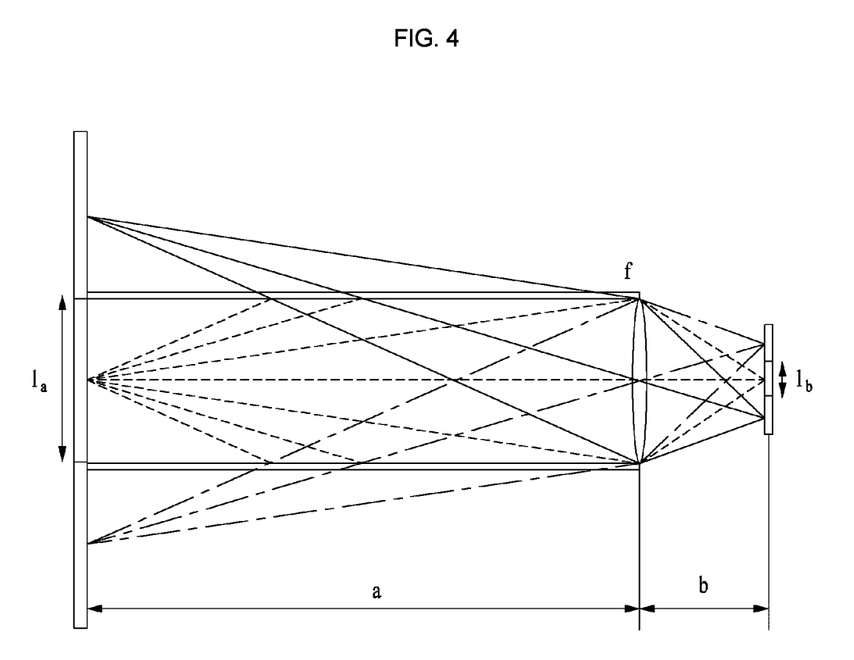
FIG. 4 is a view illustrating an image magnification.

In Equation 11, an image magnification ratio (enlargement ratio) may be denoted by $l_b/l_a$ as illustrated in FIG. 4, 'a' may denote a length from an object to a lens, which may be equal to a horizontal length of the kaleidoscope, 'f' may denote a focal length of the relay lens, and 'b' may denote a distance from the relay lens to a position on which an image is focused. For example, when a kaleidoscope having a length of 240 mm and a 60-mm lens are used, the size of each view may be reduced to ⅓ and nine images may be observed through a sensor.

The coded aperture may be manufactured in a random binary pattern, and a pixel size of the pattern may have a specific size, for example, the size of 2×2 with respect to a camera pixel size. As the pixel size of the pattern decreases, the resolving power may increase. However, since there are optical errors and diffraction issues, the pixel size of the pattern may be preferably determined based on the optical errors and diffraction issues. The pixel size of the pattern may be determined by an operator or an individual who provides the inventive concept.

Since the image having passed through the coded aperture may be blurred due to a diffraction limitation of the system, a Richard-Lucy deconvolution scheme may be applied to the image having passed through the coded aperture to overcome the diffraction limitation.

After light having passed through the coded aperture is collimated by a collimating lens, the light may be dispersed by a prism.

In this case, to prevent inconsistent focusing according to wavelengths, the collimating lens may be preferably disposed prior to the dispersion by the prism. The material and the angle of the prism may be BK-7 and 17 degrees, respectively, and the material and the angle may vary according to demands.

The relay lens focuses the dispersed light on an image sensor or a camera sensor (detector array).

A dispersion width of the dispersed light, which is sensed by the camera sensor, in a wavelength range of 450 nm to 700 nm, may be 60 pixels, and the number of wavelengths to be observed may be a specific number, for example, 26, which allows a sufficient dispersion amount, when light having the wavelength range of 450 nm to 700 nm is observed at each 10 nm.

According to the system of an embodiment of the inventive concept, since images observed by the kaleidoscope are reflected from mirrors, the images have different directions from each other. For the optimization, all the images need to have the same geometry property. Accordingly, all the images need to be subject to geometric calibration to have the same geometry property. In other words, the misalignment of mirrors forming a kaleidoscope may cause distortion to images, and thus the geometric calibration needs to be performed with respect to images output through the kaleidoscope such that the images have the same geometric property.

To this end, a checkerboard is photographed, positions of points on all the images are observed, and then homography matrices are calculated based on the relevant points.

In this case, a homography matrix is a matrix that contains information about a parallel translation, an inversion, a rotation, a proportional reduction, and the like.

If the homography matrices are applied to all the observed images, the images are aligned in the same direction, in equal sizes, and at the same position. Since distortion caused by an optical system is not completely removed, a minor difference, which remains after the homography matrices have been applied, may be removed through a specific algorithm, for example, an optical flow algorithm.

The optical flow algorithm is an algorithm of finding out shift information of each pixel between two images. All the images or all the views may be accurately matched through the optical flow algorithm.

After the homography matrices are applied to the images, adjacent images may be subject to an inversion in a light dispersion direction. Accordingly, the inversion of dispersion needs to be considered for the optimization. Bidirectional dispersion information allows the hyperspectral image information to be more accurately acquired.

Further, in the system according to the inventive concept, the hyperspectral image 'f' which is acquired by the camera and calculated from the acquisition, represents the intensity of a signal with respect to each wavelength. The intensity of the signal acquired by the camera is a value 'qel' by multiplying a radiance 'l', light efficiency 'e' of the optical system, and quantum efficiency 'q' of the sensor. Accordingly, the radiance l may be calculated by following Equation 12.

$$l = (qe)^{-1} f \qquad \text{[Equation 12]}$$

According to the inventive concept, to accurately calculate the radiance with respect to each wavelength, a correction model may be built from a specific color chart. For example, twenty four known colors are captured, and a physically meaningful and precise conversion relation is acquired by using a linear regression, CIEXYZ values are acquired by using a CIE color matching function, and RGB color values are calculated through standard RGB (sRGB) conversion.

That is, according to the inventive concept, the radiance for each wavelength is acquired, and by using the calculated radiance, color calibration may be performed on the acquired hyperspectral image.

Figure 5:
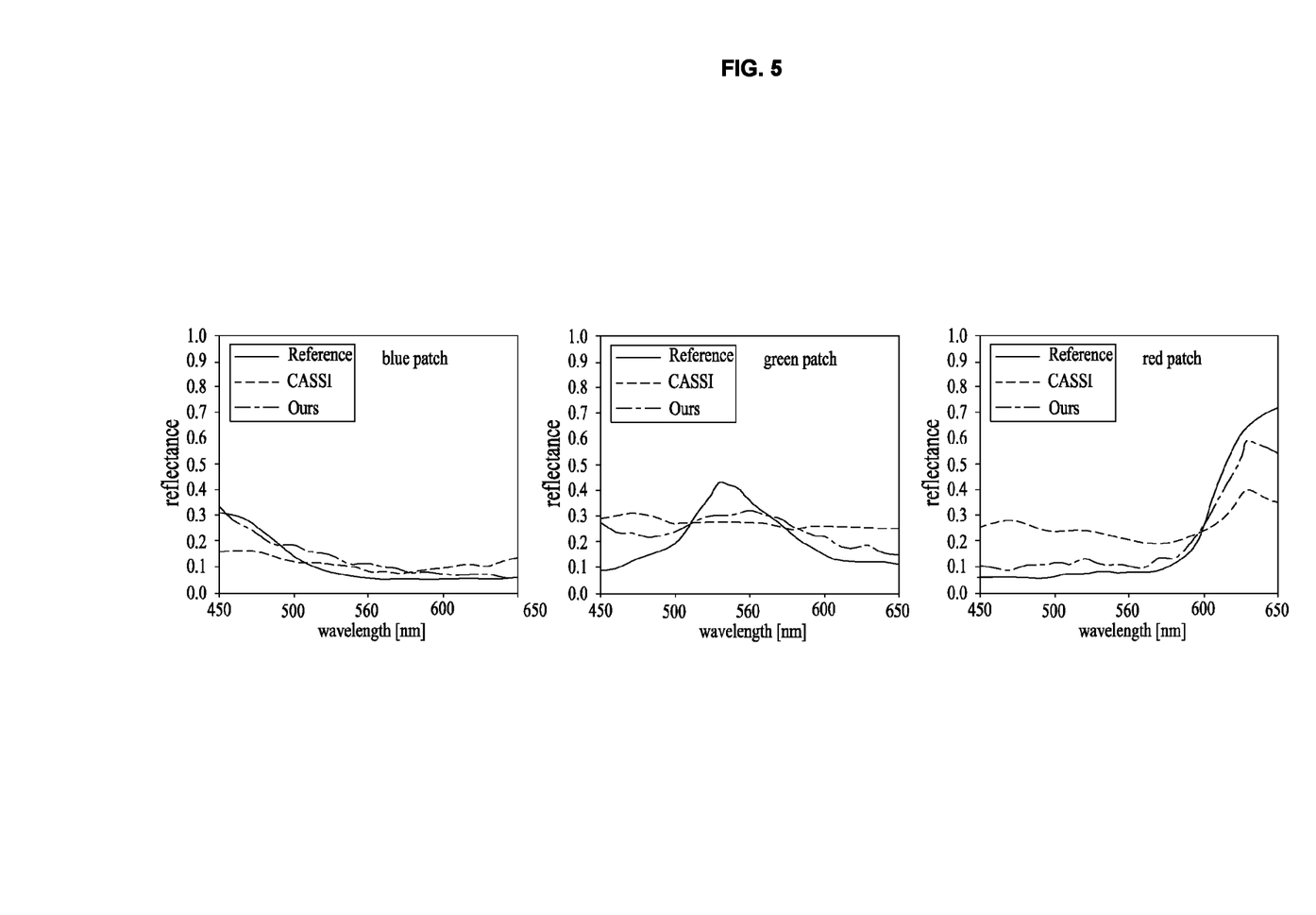
FIG. 5 illustrates a color chart captured through a conventional method and the method according to the inventive concept.

FIG. 5 illustrates results of a color chart captured through a conventional method (CASSI) and the method according to the inventive concept, in which a reference reflectance of the color chart is measured by a method or device for measuring a specific reflectance.

As illustrated in FIG. 5, it may be recognized from capturing results through the existing system (CASSI) and the method according to the inventive concept (Ours) that the inventive concept represents a higher spectral precision when comparing with that of the existing system. In other words, according to the inventive concept, the spectral resolution may be increased.

As described above, according to the method and the system of embodiments of the inventive concept, multiple samples may be acquired in a single shot to increase the number of samples, thereby acquiring a hyperspectral image having a high resolving power in a single shot.

In addition, according to the method and the system of the embodiments of the inventive concept, since the hyperspectral image is acquired in a single shot, a moving picture may be taken.

As described above, according to the inventive concept, the performance of an existing hyperspectral camera may be improved by using a kaleidoscope, and thus a higher resolution may be represented as compared to that of the existing hyperspectral camera.

In addition, according to the inventive concept, a hyperspectral image acquiring device or a hyperspectral camera may be provided by integrating the components illustrated in FIG. 3 in a single device. In other words, a kaleidoscope, which generates a plurality of images for an input image input through an objective lens, coded apertures, which generates coded-aperture passed images for the images, a collimating lens, a prism, a relay lens, and a detector (or a controller having a detection function and an observation function) may be included in a single device. Accordingly, the hyperspectral image acquiring device may perform all operations described above.

Figure 6:
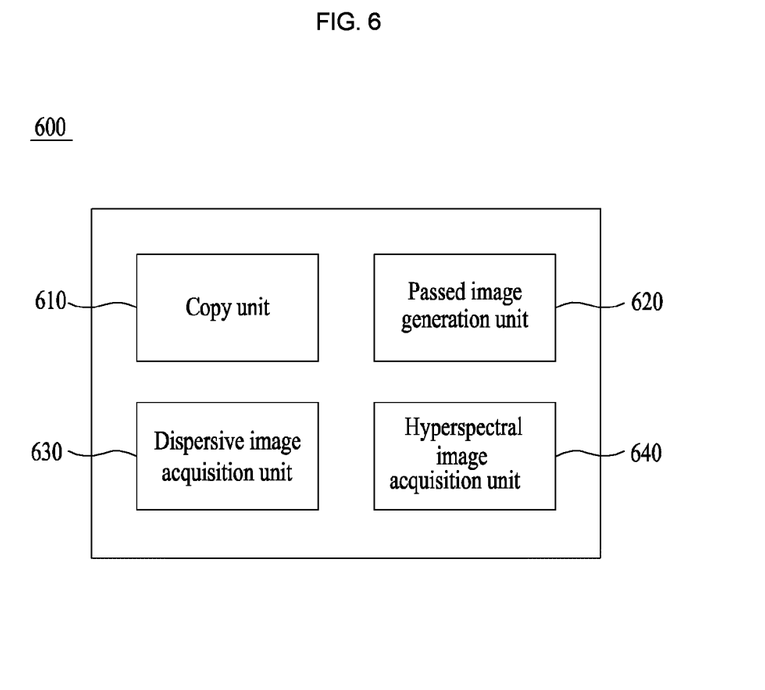
FIG. 6 is a block diagram illustrating the configuration of a system for acquiring a hyperspectral image, according to an embodiment of the inventive concept.

FIG. 6 is a block diagram illustrating the configuration of a system for acquiring a hyperspectral image, according to an embodiment of the inventive concept, in which the components illustrated in FIG. 3 are conceptually blocked.

As illustrated in FIG. 6, according to an embodiment of the inventive concept, a system 600 for acquiring a hyperspectral image includes a copy unit 610, a passed image generation unit 620, a dispersive image acquisition unit 630, and a hyperspectral image acquisition unit 640.

The copy unit 610 is a component corresponding to the kaleidoscope described in FIG. 3 and copies an input image to generate a specific number of images.

The passed image generation unit 620 is a component corresponding to the coded aperture described in FIG. 3, and the passed image generation unit 620 generates a coded-aperture passed image corresponding to each image by using the coded aperture.

Herein, the coded-aperture passed image may refer to the copied input image which has passed through the coded aperture.

The dispersive image acquisition unit 630 is a component, which acquires an image having passed through the prism described in FIG. 3, and acquires dispersive image information as the prism disperses each coded-aperture passed image.

The hyperspectral image acquisition unit 640 acquires a hyperspectral image for the input image based on the acquired dispersive image information.

In this case, the hyperspectral image acquisition unit 640 may perform geometric calibration with respect to the acquired hyperspectral image, and in detail, the hyperspectral image acquisition unit 640 may perform the geometric calibration with respect to the acquired hyperspectral image by calculating a homography matrix based on a photographed checkerboard as the checkerboard is photographed, and by applying the acquired homography matrix to the acquired hyperspectral image.

Further, the hyperspectral image acquisition unit 640 may perform primary geometric calibration using the homographic matrix and then may perform secondary geometric calibration using an optical flow algorithm.

Further, the hyperspectral image acquisition unit 640 may calculate radiance of each acquired hyperspectral image and may perform color calibration with respect to each acquired hyperspectral image based on the calculated radiance.

It will be apparent to those skilled in the art that the system according to one embodiment of the inventive concept may include all of the details described in FIGS. 1 to 5.

The foregoing systems or devices may be implemented by hardware components, software components and/or combinations thereof. For example, the systems, the devices, and components illustrated in the embodiments may be implemented in one or more general-use computers or special-purpose computers, such as a processor, a controller, an arithmetic logic unit (ALU), a digital signal processor, a microcomputer, a field programmable gate array (FPGA), a programmable logic unit (PLU), a microprocessor or any device which may execute instructions and respond. A processing unit may perform an operating system (OS) or one or more software applications running on the OS. Further, the processing unit may access, store, manipulate, process and generate data in response to execution of software. It will be understood by those skilled in the art that although a single processing unit may be illustrated for convenience of understanding, the processing unit may include a plurality of processing elements and/or a plurality of types of processing elements. For example, the processing unit may include a plurality of processors or one processor and one controller. Also, the processing unit may have a different processing configuration, such as a parallel processor.

Software may include computer programs, codes, instructions or one or more combinations thereof and may configure a processing unit to operate in a desired manner or may independently or collectively instruct the processing unit. Software and/or data may be permanently or temporarily embodied in any type of machine, components, physical equipment, virtual equipment, computer storage media or units or transmitted signal waves so as to be interpreted by the processing unit or to provide instructions or data to the processing unit. Software may be dispersed throughout computer systems connected via networks and may be stored or executed in a dispersion manner. Software and data may be stored in one or more computer-readable storage media.

The methods according to the above-described embodiments of the inventive concept may be implemented with program instructions which may be executed through various computer means and may be recorded in computer-readable media. The computer-readable media may also include, alone or in combination with the program instructions, data files, data structures, and the like. The program instructions recorded in the media may be designed and configured specially for the embodiments of the inventive concept or be known and available to those skilled in computer software. Computer-readable media include magnetic media such as hard disks, floppy disks, and magnetic tape; optical media such as compact disc-read only memory (CD-ROM) disks and digital versatile discs (DVDs); magneto-optical media such as floptical disks; and hardware devices that are specially configured to store and perform program instructions, such as read-only memory (ROM), random access memory (RAM), flash memory, and the like. Program instructions include both machine codes, such as produced by a compiler, and higher level codes that may be executed by the computer using an interpreter. The described hardware devices may be configured to act as one or more software modules to perform the operations of the above-described embodiments of the inventive concept, or vice versa.

According to embodiments of the inventive concept, the hyperspectral image having the high resolving power may be acquired by acquiring multiple samples in a single shot to increase the number of samples.

For example, according to the embodiments of the inventive concept, the hyperspectral image having the high resolving power may be acquired in the single shot by copying an input image to generate multiple images using the kaleidoscope and by allowing the multiple images to pass through different coded apertures to obtain multiple samples.

According to the embodiments of the inventive concept, the moving picture may be taken since the hyperspectral image is acquired in a single shot.

While a few exemplary embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order from those described above, and/or the aforementioned components, such as systems, structures, devices, or circuits, are combined or coupled in different forms and modes from those described above or be substituted or switched with other components or equivalents.

Therefore, the other implementation, the other embodiment, and those that are equivalent to the claims also fall within the scope of the inventive concept.

What is claimed is:

1. A camera device comprising:
   an image multiplier configured to generate a specific number of images corresponding to an input image, wherein the image multiplier comprises two or more mirrors;
   a unique coded aperture for each image of the specific number of images, each unique coded aperture configured to generate a unique coded-aperture passed image; and
   a controller configured to acquire a hyperspectral image for the input image based on the unique coded-aperture passed images and perform geometric calibration with respect to the acquired hyperspectral image.

2. The camera device of claim 1, further comprising:
   a dispersive medium configured to provide dispersive image information for each of the unique coded-aperture passed images,
   wherein the controller is configured to acquire the hyperspectral image for the input image based on the dispersive image information.

3. The camera device of claim 2, wherein the dispersive medium includes at least one of a prism, a diffraction grating, and a bandpass filter.

4. The camera device of claim 1, wherein the two or more mirrors include a kaleidoscope configured to generate the specific number of images.

5. The camera device of claim 1, wherein the controller is configured to perform the geometric calibration with respect to the acquired hyperspectral image by:
   calculating a homography matrix based on a calibration image of a checkerboard; and
   applying the calculated homography matrix to the acquired hyperspectral image.

6. The camera device of claim 5, wherein the controller is configured to perform the geometric calibration with respect to the acquired hyperspectral image by:
   performing a primary geometric calibration using the calculated homography matrix; and
   performing a secondary geometric calibration using an optical flow algorithm.

7. The camera device of claim 1, wherein the controller is configured to:
   calculate radiance of the acquired hyperspectral image; and
   perform color calibration with respect to the acquired hyperspectral image based on the calculated radiance.

8. A method of determining a hyperspectral image, comprising:
   acquiring an input image;
   copying, using an image multiplier, the input image to generate a specific number of images;
   generating, using a unique coded aperture for each image of the specific number of images, unique coded-aperture passed images;
   calculating a hyperspectral image for the input image based on the unique coded-aperture passed images; and
   performing geometric calibration with respect to the calculated hyperspectral image.

9. The method of claim 8, further comprising:
   generating, using a dispersive medium, dispersive image information for each of the unique coded-aperture passed images,
   wherein calculating the hyperspectral image for the input image is further based on the dispersive image information.

10. The method of claim 9, wherein the dispersive medium includes at least one of a prism, a diffraction grating, and a bandpass filter.

11. The method of claim 8, wherein copying, using the image multiplier, the input image to generate the specific number of images includes using a kaleidoscope.

12. The method of claim 8, wherein performing geometric calibration with respect to the calculated hyperspectral image includes:
    calculating a homography matrix based on a calibration image of a checkerboard; and
    applying the calculated homography matrix to the calculated hyperspectral image.

13. The method of claim 12, wherein performing geometric calibration with respect to the calculated hyperspectral image includes:
    performing a primary geometric calibration using the calculated homography matrix; and
    performing a secondary geometric calibration using an optical flow algorithm.

14. The method of claim 8, further comprising:
    calculating radiance of the calculated hyperspectral image; and
    performing color calibration with respect to the calculated hyperspectral image based on the calculated radiance.

15. A method of determining a hyperspectral image, comprising:
    acquiring a single input image of a scene;
    generating, using an image multiplier, a specific number of images with respect to the single input image;
    generating, using a unique coded aperture for each image of the specific number of images, unique coded-aperture passed images;
    calculating, based on the generated unique coded-aperture passed images, a hyperspectral image for the scene using the single input image; and
    performing geometric calibration with respect to the calculated hyperspectral image.

16. The method of claim 15, further comprising:
generating, using a dispersive medium, dispersive image information for each of the unique coded-aperture passed images, wherein calculating the hyperspectral image for the scene using the single input image is further based on the generated dispersive image information.

17. The method of claim 15, further comprising:
calculating radiance of the calculated hyperspectral image; and
performing color calibration with respect to the calculated hyperspectral image based on the calculated radiance.

* * * * *